United States Patent [19]
Fitzgerald et al.

[11] Patent Number: 4,811,067
[45] Date of Patent: Mar. 7, 1989

[54] HIGH DENSITY VERTICALLY STRUCTURED MEMORY

[75] Inventors: Brian F. Fitzgerald; Kim Y. T. Nguyen; Son V. Nguyen, all of Essex Junction, Vt.

[73] Assignee: International Business Machines Corporation, Armonk, N.Y.

[21] Appl. No.: 858,787

[22] Filed: May 2, 1986

[51] Int. Cl.⁴ ................. H01L 27/04; G11C 11/40
[52] U.S. Cl. ........................... 357/23.6; 357/23.4; 357/55; 365/149
[58] Field of Search .......... 357/23.3, 23.4, 23.6, 357/55; 365/149

[56] References Cited

U.S. PATENT DOCUMENTS

| | | | |
|---|---|---|---|
| 3,387,286 | 6/1968 | Dennard | 357/23.6 |
| 3,811,076 | 5/1974 | Smith | 357/23.6 |
| 3,841,926 | 10/1974 | Garnache et al. | 357/23.6 |
| 4,199,772 | 4/1980 | Natori et al. | 357/23.6 |
| 4,222,062 | 9/1980 | Trotter et al. | 357/45 |
| 4,225,945 | 9/1980 | Kuo | 365/149 |
| 4,271,418 | 6/1981 | Hiltpold | 357/23.6 |
| 4,276,557 | 6/1981 | Levinstein et al. | 357/71 S |
| 4,295,924 | 10/1981 | Garnache et al. | 357/23.6 |
| 4,327,476 | 5/1982 | Iwai et al. | 357/23.6 |
| 4,335,450 | 6/1982 | Thomas | 365/182 |
| 4,364,074 | 12/1982 | Garnache et al. | 357/41 |
| 4,462,040 | 7/1984 | Ho et al. | 357/23.6 |
| 4,663,832 | 5/1987 | Jambatkar | 357/50 |
| 4,689,113 | 8/1987 | Balasubramanyam et al. | 357/71 R |

FOREIGN PATENT DOCUMENTS

WO81/3241  11/1981  PCT Int'l Appl. ........... 357/23.6

Primary Examiner—William D. Larkins
Attorney, Agent, or Firm—Stephen J. Limanek

[57] ABSTRACT

A dynamic random access memory is provided wherein each cell has a storage capacitor and switching device and a bit/sense line or plate located along a sidewall of a trench formed in a semiconductor substrate. In a more particular structure of the cell, the trench width defines the length of the switching device, with the storage capacitor and a highly conductive bit/sense line being formed along opposite sidewalls of the trench. In an array of such cells, the highly conductive bit/sense line or plane interconnecting a large number of the cells of the array extends continuously from cell to cell within the trench at a sidewall thereof. Likewise, the storage capacitors of these many cells have a highly conductive common plate extending continuously within the trench at the opposite sidewall.

14 Claims, 3 Drawing Sheets

HIGH DENSITY VERTICALLY STRUCTURED MEMORY

TECHNICAL FIELD

This invention relates to integrated semiconductor memory circuits and more particularly to a dynamic memory with a high density of cells, each of which employs a capacitor for storing a binary digit of information.

BACKGROUND ART

Integrated semiconductor memory circuits, particularly those employing cells which include essentially a storage capacitor and a switch have achieved high memory cell densities. One of the simplest circuits for providing a small dynamic memory cell is described in commonly assigned U.S. Pat. No. 3,387,286, filed July 14, 1967, by R. H. Dennard. Each cell employs a storage capacitor and a field effect transistor acting as a switch to selectively connect the capacitor to a bit/sense line.

In also commonly assigned U.S. Pat. Nos. 3,811,076 by W. M. Smith, and 3,841,926 by R. A. Garnache and W. M. Smith, both filed on Jan. 2, 1973, there is disclosed a one device field effect transistor memory cell of the type described in the hereinabove identified Dennard patent which utilizes a layer of doped polysilicon and an N+ diffusion region in a P type conductivity semiconductor substrate separated by a dielectric medium disposed on the surface of the semiconductor substrate for forming the storage capacitor of the cell. The polysilicon layer extends beyond the storage capacitor to act as a field shield between adjacent cells by applying a negative bias or fixed negative potential to the polysilicon layer. The N+ diffusion region of the storage capacitor is formed by using a doped segment of an insulating layer disposed on the surface of the semiconductor substrate and outdiffusing the dopant into the substrate.

Although the cells described hereinabove do provide memories having a high density of cells in a planar or two dimentional arrangement, yet each cell does require a significant given area of semiconductor substrate surface. To reduce the size of the given surface area for each cell, structures have been made wherein a semiconductor device or a cell is formed in a three dimentional arrangement. In commonly assigned U.S. Pat. No. 4,295,924, filed on Dec. 17, 1979 by R. R. Garnache and D. M. Kenney, there is disclosed a semiconductor device located within a groove or trench with a self-aligned conductive layer formed on a wall of the trench either directly or on a supporting insulating layer as an element of the device. A memory cell formed in a groove or trench is described in commonly assigned U.S. Pat. No. 4,335,450, filed on Jan. 30, 1980, by D. R. Thomas, wherein there is disclosed a cell having a transistor disposed on a sidewall of a groove or trench with the storage node disposed below the transistor. Also U.S. Pat. No. 4,327,476, filed on Nov. 28, 1980, describes a vertical cell having the storage capacitor in a well or trench.

Patent Cooperation Treaty (PCT) Publication No. WO 81/03241, dated Nov. 12, 1981, discloses a one device memory cell structure wherein the storage capacitor is disposed in a trench with the switching device and bit/sense line located at the surface of the substrate.

Furthermore, commonly assigned U.S. Pat. No. 4,462,040, filed on Mar. 30, 1980, by I. T. Ho and J. Riseman, discloses a one device dynamic random access memory utilizing a trench having vertical sidewalls with the storage capacitor and the transfer device located within the trench, and U.S. Pat. Nos. 4,271,418, filed on Oct. 29, 1979, and 4,225,945, filed on June 6, 1977, and U.S. Pat. No. 4,751,558 filed on Oct. 31, 1985, by D. M. Kenney, teach a one device memory cell formed in a groove or trench with the storage node located at the bottom of the trench, the bit/sense line at the top of this structure and the transfer device on the sidewall of the trench.

Finally, U.S. Pat. No. 4,222,062, filed on May 4, 1976, discloses a memory cell structure wherein a switching device is formed near the bottom of a trench with the bit line and storage capacitor located at a wall of the trench.

DISCLOSURE OF THE INVENTION

It is an object of this invention to provide a memory cell, in a three dimensional arrangement, requiring a very small area of the surface of a semiconductor substrate, including a groove or trench within which are disposed the elements of the cell.

In accordance with the teachings of this invention, a dynamic random access memory is provided wherein each cell has a storage capacitor and switching device and a bit/sense line or plate located along a sidewall of a trench formed in a semiconductor substrate. In a more particular structure of the cell, the trench width defines the length of the switching device, with the storage capacitor and a highly conductive bit/sense line being formed along opposite sidewalls of the trench. In an array of such cells, the highly conductive bit/sense line or plate interconnecting a large number of the cells of the array extends continuously from cell to cell within the trench at a sidewall thereof. Likewise, the storage capacitors of these many cells have a highly conductive common plate extending continuously within the trench at the opposite sidewall.

The foregoing and other objects, features and advantages of the invention will be apparent from the following and more particular description of the preferred embodiments of the invention, as illustrated in the accommpanying drawings.

BEST MODE FOR CARRYING OUT THE INVENTION

Figure 1:
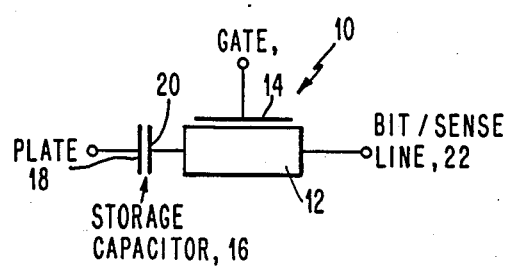
FIG. 1 is a circuit diagram of a dynamic one device memory cell indicating the principal elements thereof.

Referring to the drawings in more detail, there is shown in FIG. 1 a circuit diagram of a well known one device dynamic memory cell 10 which includes a field effect transistor 12 having a gate 14, a storage capacitor 16 having a conductive plate 18 and a storage node 20, and a bit/sense line 22. As is known, to store a binary digit in the storage capacitor 16, a high or low voltage is applied to the bit/sense line 22 and the transistor 12 is turned on to charge the storage node 20 if a high voltage was applied to the bit/sense line 22, indicating the presence of, say, a 1 digit, otherwise the storage node 20 remains uncharged, indicating the presence of a stored 0 digit. To read information from the storage capacitor 16, the bit/sense line 22 is charged to an intermediate voltage and the transistor 12 is turned on. If the bit/sense line 22 is discharged, a sense amplifier (not shown) connected to the bit/sense line 22 will indicate the presence of a 0 digit in the storage capacitor 16, otherwise the storage capacitor 16 was storing a 1 digit.

Figure 2:
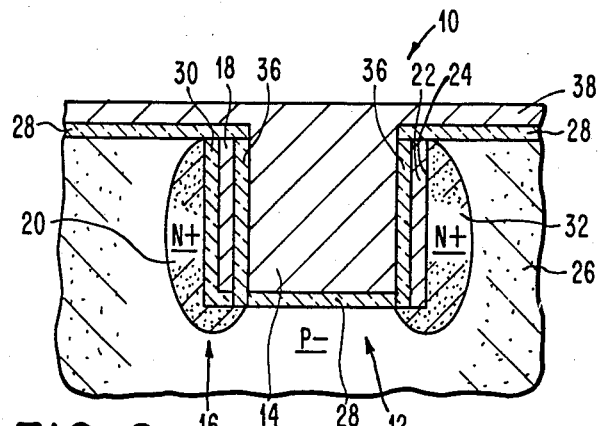
FIG. 2 is a sectional view taken through line 2—2 of FIG. 3 of the cell structure of the present invention.
Figure 3:
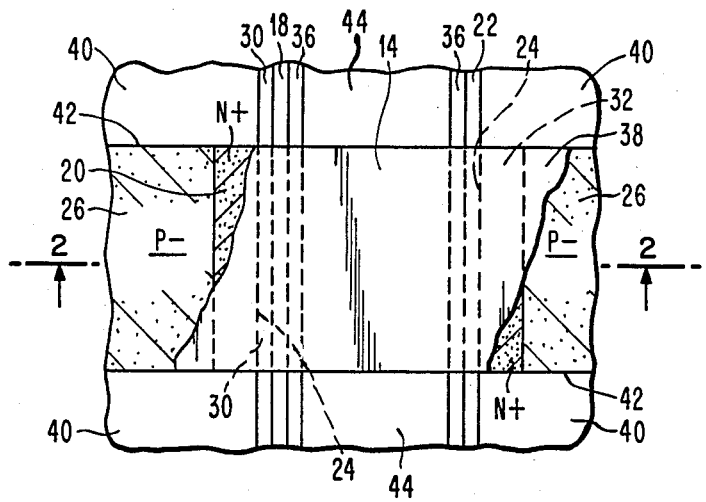
FIG. 3 is a plan view of the cell of the present invention.

In accordance with the teachings of this invention, a novel vertical structure of the memory circuit of FIG. 1 is illustrated in FIGS. 2 and 3, wherein FIG. 3 is a plan view of the structure and FIG. 2 is a sectional view taken through line 2—2 of FIG. 3. As shown in FIGS. 2 and 3, the field effect transistor 12, the storage capacitor 16 and the bit/sense line 22 are all located within a trench 24 formed in a semiconductor substrate 26, preferably made of silicon and having a P− conductivity. The transistor 12 includes the gate 14 which is preferably doped polysilicon or titanium silicide (TiSi$_2$) separated from the bottom of the trench 24 by thin insulating layer 28 preferably made of silicon dioxide or silicon oxynitride. The storage capacitor 16 includes the storage node 20 made in the form of an N+ diffusion region disposed generally along a sidewall of the trench 24 and the conductive plate 18, which may be a metallic layer of, e.g., copper-doped aluminum or titanium silicide, separated from the N+ diffusion region 20 by an insulating layer 30 preferably also made of silicon dioxide. An N+ diffusion region 32 similar to that of the N+ diffusion region 20 is formed on the sidewall of the trench 24 opposite to the sidewall in which region 20 is formed. The N+ diffusion region 32 serves as the drain of the transistor 12. The bit/sense line 22 is disposed along the same sidewall as the drain diffusion region 32 and in electrical contact with region 32. The bit/sense line 22 is a highly conductive plate or film, preferably made of copper-doped aluminum or titanium silicide. A layer of insulation 36 is formed over the capacitor plate 18, the bit/sense line plate 22 and over the surface of the silicon substrate 26 so as to insulate the gate 14 of transistor 12 from the conductive plates 18 and 22. A word line 38 to which the gate 14 may be integrally connected is disposed over the insulating layer 28. The word line 38 is also preferably made of doped polysilicon or titanium silicide. As can be seen in FIG. 3 of the drawings, first segments of insulation 40 are disposed adjacent to the silicon substrate 26 within an isolation trench 42 extending along the edges of the word line 38 and second segments of insulation 44 are disposed adjacent to the gate 14 within the isolation trench 42 along the edges of the word line 38. The first segments of insulation 40 are preferably made of silicon dioxide and the second segments of insulation 44 are preferably made of cured polyimide.

It can be seen from FIGS. 2 and 3 that a very compact one device dynamic memory cell has been made in a vertical structure wherein all elements of the cell are located within a trench. The trench may be made as deep and as wide as necessary to provide a storage capacitor of desired size, to provide a bit/sense line of desired conductivity and to provide a transistor of desired switching characteristics. In one arrangement of the structure of the present invention, the depth of the trench 24 is preferably 1.3 microns with a width of also 1.3 microns, and the width of the channel of the transistor 12 likewise being 1.3 microns, with the length of the channel being equal to 1.3 microns minus the thicknesses of the plates 22 and 18 and the insulating layers 30 and 36. The layer of insulation 28 forming the gate oxide of the transistor 12 is 100 angstroms and the layer of insulation 30 forming the dielectric of the storage capacitor 16 is also 100 angstroms, with the layer of insulation 36 being 0.1 microns and each of the plates 18 and 24 being 0.2 microns. The N+ diffusion regions 20 and 32 each extend 0.3 microns from their respective sidewalls of the trench 24. With a spacing between adjacent cells of an array of cells along the word line direction equal to 1.2 microns and along the bit/sense line direction, which is orthogonal to that of the word line direction, equal to 1.0 micron the semiconductor substrate cell size is equal to only 5.75 square microns. Furthermore, the capacitance of the storage capacitor 16 versus the capacitance of the bit/sense line 22, assuming 64 cells per bit/sense line, provides a very desirable transfer ratio of at least 13%.

Figure 4:
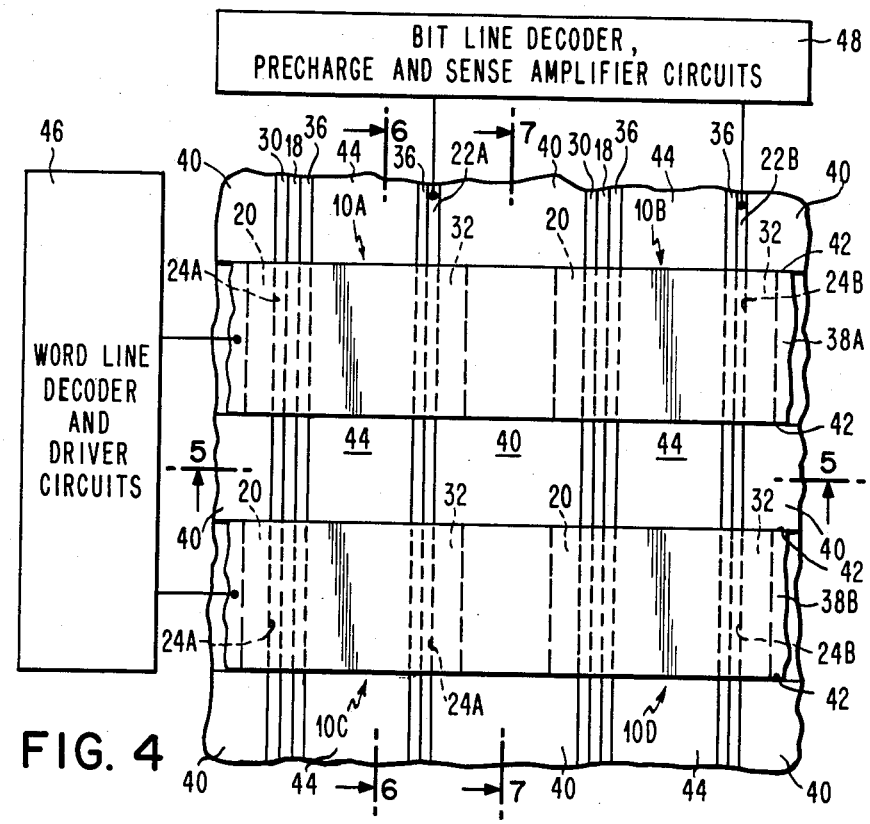
FIG. 4 is a plan view of an array of cells of the type illustrated in FIGS. 2 and 3, FIGS. 5, 6 and 7 are sectional views of the array illustrated in FIG. 4 taken through lines 5—5, 6—6 and 7—7, respectively.
Figure 5:
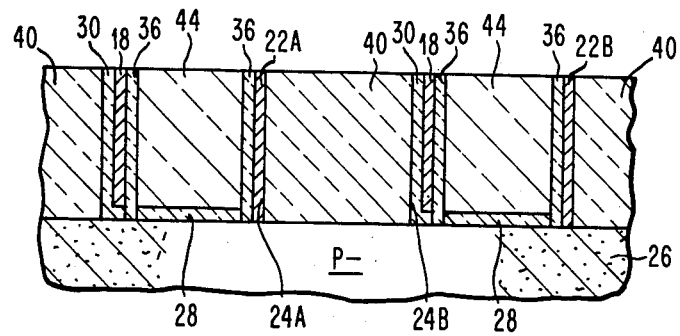

FIG. 4 is a plan view of an array of cells of the type illustrated in FIGS. 2 and 3 of the drawings, wherein like reference characters refer to similar elements, with two cells 10A and 10B aligned in the horizontal direction along a word line 38A and two cells 10C and 10D aligned in the horizontal direction along a word line 38B. The cells 10A and 10C are also aligned in the vertical direction along bit/sense line 22A and the cells 10B and 10D are aligned in the vertical direction along bit/sense line 22B. FIG. 5 is a sectional view of FIG. 4 taken through line 5—5 thereof, FIG. 6 is a sectional view of FIG. 4 taken through line 6—6 thereof and FIG. 7 is a sectional view of FIG. 4 taken through line 7—7 thereof to more clearly show the details of the elements of the cells 10A, 10B, 10C and 10D of the array.

By referring to FIGS. 4 and 5, wherein FIG. 5 is taken through the isolation trench 42, it can be readily seen that the cells 10A and 10C are located within a trench 24A with a polyimide insulating segment 44 separating these cells 10A and 10C, and the cells 10B and 10D are located within a trench 24B with another polyimide insulating segment 44 separating these two cells 10B and 10D. It can also be seen that the bit/sense lines 22A and 22B extend vertically throughout the array in contact with the N+ diffusion regions 32 of the cells 10A and 10C and cells 10B and 10D, respectively. It should be noted that each of the bit/sense lines 22A and 22B has an independent plate line to which different and independent voltages may be applied depending upon design considerations. Likewise, each of the capacitor plates 18 extends along its respective trench 24A or 24B.

Figure 6:
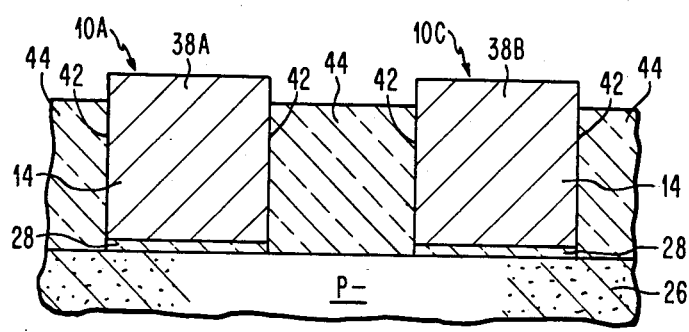
Figure 7:
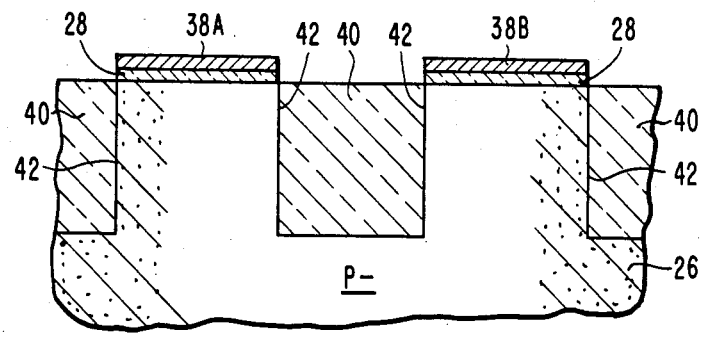

By referring to FIGS. 4 and 6 of the drawings, wherein FIG. 6 is taken through the device trench 24A, it can be seen that the gates 14 of the cells 10A and 10C are separated from each other by the polyimide segments 44 and from the P− silicon substrate region 26 by the thin layer of silicon dioxide 28. Furthermore, by referring to FIG. 7 of the drawings, the isolation trenches 42 can be seen more clearly passing through the silicon substrate 26. Also, FIG. 7 shows the word lines 38A and 38B isolated from the silicon substrate 26 by the insulating layer 28. The width of each isolation trench 42 may be equal to approximately 1.0 micron, with the depth being equal to that of the depth of the device trenches 24A and 24B, and the separation between device trenches 24A and 24B may be equal to approximately 1.2 microns.

As is known, to write into or read from a random access memory array as shown in FIG. 4, word line decoder and driver circuits 46 and bit line decoder, precharge and sense amplifier circuits 48 of any known type may be used to select any one or more of the cells 10A, 10B, 10C and 10D.

Figures 8, 9:
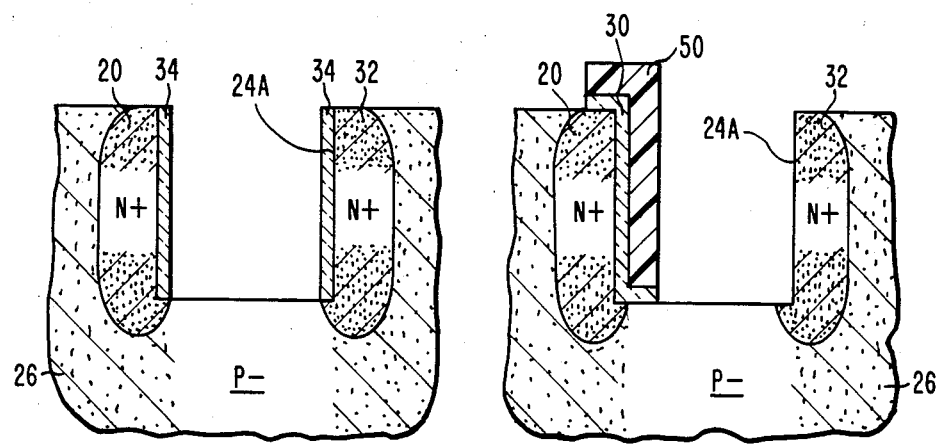
FIGS. 8, 9 and 10 are sectional views of the cell illustrated in FIGS. 2 and 3 taken during successive steps in the process of making the cell.

Any known process may be used to make the memory cells of the present invention. In one particular process, the isolation trenches 42 shown in FIGS. 3, 4, 6 and 7 may be formed by known reactive ion etching techniques in the silicon substrate 26 first and filled with an insulating material such as silicon dioxide. The device trenches 24A and 24B are then formed in the substrate 26 orthogonally with respect to the direction of the isolation trenches 42. A layer of doped insulation 34 as indicated in FIG. 8 of the drawings is then chemically vapor deposited on the sidewalls land bottom of the device trenches 24A and 24B and on the upper surface of the substrate 26. By using known reactive ion etching techniques, the doped insulating layer 34 is removed from the bottom of the trenches 24A and 24B and from the upper surface of the substrate 26, leaving only segments of the doped insulating layer 34 on the sidewalls of the trenches 24A and 24B, as indicated in FIG. 8 of the drawings. By using appropriate techniques, the dopant, which may be arsenic or phosphorous, in the layer 34 is driven into the sidewalls of the trenches 24A and 24B to from the N+ diffusion regions 20 and 32, as also indicatetd in FIG. 8 of the drawings. After drive-in, any appropriate wet etchant, such as potassium hydroxide (KOH), may be used to remove the segments of the doped insulating layer 34.

As indicatted in FIG. 9 of the drawings, the layer of silicon dioxide 30 is grown on the sidewalls and bottom of the trenches 24A and 24B, as well as on the upper surface of the substrate 26 to provide the dielectric layer for the storage capacitor 16. To remove unwanted portions of the silicon dioxide layer 30, a layer of photoresist 50 is deposited over the silicon dioxide layer 30 and appropriately masked and etched so as to protect only that portion of the silicon dioxide layer 30 on the sidewall of the trenches 24A and 24B adjacent to the N+ diffusion region 20 required for the dielectric layer of the storage capacitor 16. The unwanted portions of the silicon dioxide layer 30 are then removed by the use of any suitable etchant, such as a carbon tetrafluoride ($CF_4$) plus oxygen ($O_2$) plasma or a wet etchant potassium hydroxide. Any appropriate wet etchant may be used to remove the remaining portions of the photoresist layer 50.

Figure 10:
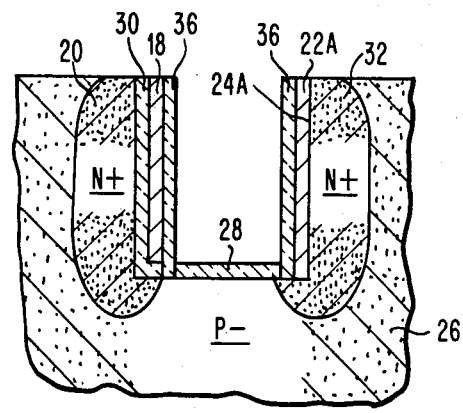

A conductive layer, preferably copper-doped aluminum or tungsten or titanium silicide, is deposited within the trenches 24A and 24B and on the surface of the substrate 26 and appropriately removed by reactive ion etching techniques from the bottom of the trenches 24A and 24B and from the upper surface of the substrate 26 to form the storage capacitor plate 18 and the bit/sense line 22, as shown in FIG. 10 of the drawings. By chemical vapor deposition techniques the layer of insulation 36 is deposited over the entire structure and by reactive ion etching techniques, the layer of insulation 36 is removed from the bottom of the trenches 24A and 24B and from the surface of the semiconductor substrate 26, as indicated in FIG. 10 of the drawings. To complete the process of making the cell, the thin layer of silicon dioxide 28 is grown at the bottom of the trenches 24A and 24B and at the upper surface of the substrate 26 followed by the deposition of polysilicon or titanium silicide to form the gate 14 and the word lines 38A and 38B, as indicated more clearly in FIG. 2 of the drawings.

It should be noted particlarly from FIG. 4 that when the polysilicon, which is appropriately doped to increase its conductivity, is etched to form the word lines 38A and 38B, polysilicon deposited within the isolation trenches 42 between the gates of the transistors of the cells 10A, 10B, 10C and 10D, such as between cell 10A and cell 10C and between cell 10B and cell 10D will also be etched out leaving cavities in the isolation trenches 42. These cavities are then preferably filled with a polyimide and appropriately cured to form the polyimide segments 44.

Although not shown it should be understood that, if desired, after growing the layer of silicon dioxide 30 for the dielectric medium of the storage capacitors 16, a thin layer of polysilicon may be deposited over the layer 30 to enhance metal adhesion. Furthermore, if desired, the layer of insulation 36 formed on the capacitor plate 18 and on the bit/sense line 22 may be made of silicon oxynitride (SiNO) or silicon nitride ($Si_3N_4$). If tungsten is used as the metal for the capacitor plate 18 and the bit/sense line 22, it is preferred that a thin layer of polysilicon be deposited over the tungsten in order to provide a thin layer of tungsten silicide over the tungsten. Additionally, a layer of silicon oxynitride (SiNO) may be deposited over the layer of grown silicon dioxide 28 to form the gate oxide of the transistors 12 of the storage cells 10A, 10B, 10C and 10D.

It can be readily seen in accordance with the teachings of this invention that an improved dynamic memory cell has been provided in a vertical structure within a semiconductor substrate requiring a very small substrate surface area by forming within a vertical trench or groove the storage capacitor, the transfer device and the highly conductive bit/sense line of the cell.

While the invention has been particularly shown and described with reference to preferred embodiments thereof, it will be understood by those skilled in the art that various changes in form and details may be made therein without departing from the spirit and scope of the invention.

What is claimed is:

1. A memory array comprising a semiconductor substrate having a first type conductivity and having a plurality of parallelly-arranged trenches and a plurality of elongated isolation regions arranged in a direction orthogonal to the direction of said trenches so as to define a plurality of cell regions,
   a plurality of memory cells, each of said cells being disposed within a respective one of said cell regions,
   each of said cells including a transistor having a diffusion region of a second type conductivity disposed on a given sidewall of a respective one of said trenches and a storage capacitor coupled to said diffusion region through said transistor and
   a plurality of conductive lines, each line being disposed substantially entirely within a respective one of said trenches along said given sidewall and in electrical contact with a plurality of said diffusion regions disposed on said given sidewall in said respective trench.

2. A memory array as set forth in claim 1 wherein said conductive lines are metallic plates disposed in physical contact with said diffusion regions.

3. A memory array as set forth in claim 2 wherein said storage capacitors are disposed on sidewalls of said trenches opposite to said given sidewalls.

4. A memory array as set forth in claim 3 wherein said transistors are field effect transistors having gate electrodes disposed at the bottom of said trenches and separated therefrom by a layer of insulation.

5. A memory array as set forth in claim 4 further including a plurality of parallelly-arranged word lines disposed in a direction orthogonal to the direction of said trenches and contacting said gate electrodes.

6. A memory array as set forth in claim 1 wherein each of said isolation regions includes a given trench formed in said semiconductor substrate filled with insulating material.

7. A memory array as set forth in claim 5 wherein each of said word lines and the gate electrodes contacting the respective word line is an integral structure made of doped polysilicon.

8. A memory array as set forth in claim 7 further including a second plurality of conductive lines, each of said second conductive lines being disposed within a respective trench on the sidewall thereof opposite to said given sidewall and connected to a plurality of said storage capacitors.

9. A memory array as set forth in claim 8 wherein said second pluralilty of lines are metallic films.

10. A memory array as set forth in claim 8 wherein said conductive lines are made of titanium silicide.

11. A memory array as set forth in claim 8 wherein said conductive lines are made of copper-doped aluminum.

12. A memory array as set forth in claim 8 wherein said conductive lines are made of tungsten.

13. A memory array as set forth in claim 5 wherein said gate electrodes and said word lines are made of titanium silicide and said semiconductor substrate is made of silicon.

14. A memory array as set forth in claim 6 wherein said insulating material includes segments of silicon dioxide and segments of polyimide.

* * * * *